US010349549B2

(12) United States Patent
Schuetz et al.

(10) Patent No.: US 10,349,549 B2
(45) Date of Patent: Jul. 9, 2019

(54) ELECTRICALLY SHIELDED DIRECT CURRENT LINK BUSBAR

(71) Applicant: General Electric Company, Schenectady, NY (US)

(72) Inventors: Tobias Schuetz, Bavaria (DE); Xiaoting Dong, Bavaria (DE); Philipp Leuner, Bavaria (DE)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/662,741

(22) Filed: Jul. 28, 2017

(65) Prior Publication Data

US 2018/0116065 A1    Apr. 26, 2018

Related U.S. Application Data

(60) Provisional application No. 62/412,592, filed on Oct. 25, 2016.

(51) Int. Cl.
*H02M 7/00* (2006.01)
*H05K 7/14* (2006.01)
*H02M 1/44* (2007.01)
*H05K 9/00* (2006.01)

(52) U.S. Cl.
CPC ............ *H05K 7/1457* (2013.01); *H02M 1/44* (2013.01); *H02M 7/003* (2013.01); *H05K 7/1432* (2013.01); *H05K 9/002* (2013.01)

(58) Field of Classification Search
None
See application file for complete search history.

(56) References Cited

U.S. PATENT DOCUMENTS

| 7,061,775 | B2 | 6/2006 | Beihoff et al. | |
| 7,547,987 | B2 | 6/2009 | Torigoe et al. | |
| 8,184,450 | B1 | 5/2012 | Goergen | |
| 9,166,309 | B1* | 10/2015 | Costello | H01R 25/161 |
| 9,520,810 | B2* | 12/2016 | Li | H02M 7/487 |
| 9,923,478 | B2* | 3/2018 | Feuerstack | H01G 9/008 |
| 2001/0000762 | A1* | 5/2001 | Shepherd | H05K 1/0263 |
| | | | | 439/55 |

(Continued)

FOREIGN PATENT DOCUMENTS

| CN | 104270111 A | 1/2015 |
| DE | 10 2012 007 740 A1 | 10/2012 |

OTHER PUBLICATIONS

Ye et al., "The EMI benefits of ground plane stitching in multi-layer power bus stacks", Electromagnetic Compatibility, 2000. IEEE International Symposium on, vol. 02, Aug. 21-25, 2000, Washington, DC.

(Continued)

*Primary Examiner* — Xanthia C Cunningham
(74) *Attorney, Agent, or Firm* — Armstrong Teasdale LLP

(57) ABSTRACT

A shielded direct current link ("DC link") busbar includes a central planar element that includes a first surface and a second surface axially opposed to the first surface. The shielded DC link busbar further includes a first conductive lamina disposed over the first surface and a second conductive lamina disposed over the second surface. Further, the first conductive lamina and the second conductive lamina are electrically coupled.

18 Claims, 6 Drawing Sheets

(56) References Cited

U.S. PATENT DOCUMENTS

| | | | | |
|---|---|---|---|---|
| 2001/0049211 A1* | 12/2001 | Sumida | ............... | B60R 16/0238 439/76.2 |
| 2002/0009907 A1* | 1/2002 | Kasai | ................. | B60R 16/0238 439/76.2 |
| 2004/0032306 A1* | 2/2004 | Hasegawa | ............... | H01P 1/387 333/24.2 |
| 2004/0062006 A1* | 4/2004 | Pfeifer | ..................... | F28F 3/12 361/699 |
| 2004/0069527 A1* | 4/2004 | Vanhoutte | .............. | H02G 5/005 174/149 B |
| 2006/0152085 A1 | 7/2006 | Flett et al. | | |
| 2010/0050768 A1* | 3/2010 | Takeyama | ......... | G01C 19/5607 73/504.16 |
| 2011/0141666 A1* | 6/2011 | Fontana | .................. | H02B 1/20 361/624 |
| 2012/0202383 A1* | 8/2012 | Harao | .................... | H01H 85/22 439/620.29 |
| 2013/0234636 A1 | 9/2013 | Savatski et al. | | |
| 2013/0279085 A1 | 10/2013 | Wang | | |
| 2013/0314827 A1* | 11/2013 | Sohn | .................... | H01H 71/125 361/57 |
| 2014/0077611 A1 | 3/2014 | Young et al. | | |
| 2014/0085772 A1* | 3/2014 | Oh | ....................... | H05K 1/0231 361/329 |
| 2014/0111959 A1 | 4/2014 | Li et al. | | |
| 2015/0035496 A1 | 2/2015 | Kikuchi | | |
| 2015/0340157 A1* | 11/2015 | Wen | ...................... | H02M 7/003 361/328 |
| 2015/0340963 A1* | 11/2015 | Huang | ................. | H02M 7/219 363/126 |

OTHER PUBLICATIONS

Caponet et al., "Low stray inductance bus bar design and construction for good EMC performance in power electronic circuits", IEEE Transactions on Power Electronics, vol. 17, Issue: 2, pp. 225-231, Mar. 2002.

International Search Report and Written Opinion issued in connection with corresponding PCT Application No. PCT/US2017/053575 dated Dec. 20, 2017.

\* cited by examiner

US 10,349,549 B2

ELECTRICALLY SHIELDED DIRECT CURRENT LINK BUSBAR

CROSS REFERENCE TO RELATED APPLICATIONS

This application claims the benefit of U.S. Provisional Patent Application No. 62/412,592, filed Oct. 25, 2016, which is hereby incorporated by reference in its entirety.

BACKGROUND

The subject matter disclosed herein relates to a direct current link ("DC link") busbar for a power electronic system and, more particularly, to an electrically shielded DC link busbar for a power electronic system that includes a fast switching power inverter.

At least some DC links are used in large-scale power electronic systems to conduct electrical current from a power source to a system within the enclosure. In particular, some DC link busbars are used to conduct electrical current from an electrical storage element, such as a capacitor bank, to one or more power inverters housed within the cabinet. Within the cabinet, the power inverters convert direct current to alternating current for use as electrical power.

Many known power inverters include fast switching semiconductor switching elements, such as silicon carbide ("SiC") semiconductor switching elements. Such semiconductor switching elements are capable of reducing switching losses through increased switching frequency and so afford an advantage over more conventional power inverters. However, the increased switching frequency and/or increased slew rate of fast switching power inverters may result in the production of higher frequency noise, which may flow onto the DC link busbar, causing many conventional DC link busbars to act as antenna transmitters.

BRIEF DESCRIPTION

In one aspect, a shielded direct current link ("DC link") busbar is provided. The shielded DC link busbar includes a central planar element that includes a first surface and a second surface axially opposed to the first surface. The shielded DC link busbar further includes a first conductive lamina disposed over the first surface and a second conductive lamina disposed over the second surface. Further, the first conductive lamina and the second conductive lamina are electrically coupled.

In another aspect, a power conversion system is provided. The power conversion system includes a plurality of capacitors, at least one power inverter, and a shielded DC link busbar that is electrically coupled to the plurality of capacitors and the at least one power inverter. The shielded DC link busbar includes a central planar element that includes a first surface and a second surface axially opposed to the first surface. The shielded DC link busbar further includes a first conductive lamina disposed over the first surface and a second conductive lamina disposed over the second surface. Further, the first conductive lamina and the second conductive lamina are electrically coupled.

In yet another aspect, a power generation system is provided. The power generation system includes a power source, a plurality of capacitors, at least one power inverter, and a shielded DC link busbar that is electrically coupled to the power source, the plurality of capacitors, and the at least one power inverter. The shielded DC link busbar includes a central planar element that includes a first surface and a second surface axially opposed to the first surface. The shielded DC link busbar further includes a first conductive lamina disposed over the first surface and a second conductive lamina disposed over the second surface. Further, the first conductive lamina and the second conductive lamina are electrically coupled.

DRAWINGS

These and other features, aspects, and advantages of the present disclosure will become better understood when the following detailed description is read with reference to the accompanying drawings in which like characters represent like parts throughout the drawings, wherein.

Figure 1:
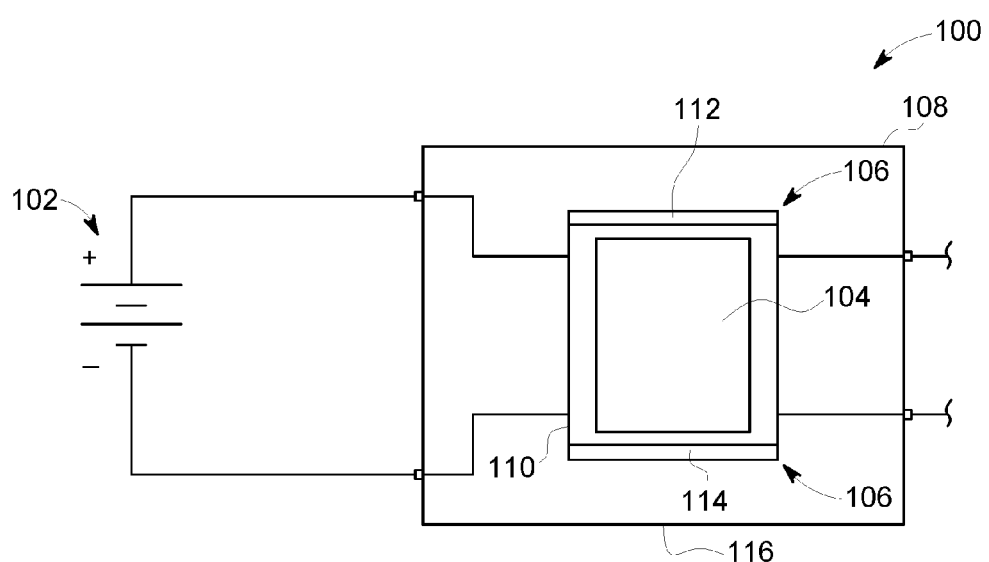
FIG. 1 is a perspective view of the exemplary power conversion system that includes a shielded direct current link ("DC link") busbar.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "lamina," "layer," and "sheet" describe any broad, flat, piece of material, including, as described below, broad, flat, conductive and insulative pieces of material.

Although generally described herein with respect to a photovoltaic array ("PV array"), the systems described herein are applicable to any type of electric generation system including, for example, solar power generation systems, fuel cells, geothermal generators, hydropower generators, and/or other devices that generate power from renewable and/or non-renewable energy sources.

Embodiments of the present disclosure relate to a power conversion system in which direct current is transmitted from a power source, such as a PV array, through a shielded direct current link ("DC link") busbar, to a fast switching power inverter, such as a silicon carbide ("SiC") power inverter. The fast switching power inverter converts the direct electrical current to alternating electrical current. In the process, however, high frequency noise is generated. This high frequency noise flows onto the DC link busbar, where it either follows a shortened path back to the power inverter or is shunted to ground. Thus, the DC link busbar is discouraged from radiating as an antenna in response to the presence of high frequency alternating current flowing onto the DC link busbar. Further, emissions that are generated by the DC link busbar are attenuated by electrical shielding included in the DC link busbar.

FIG. 1 is a perspective view of the exemplary electrical power generation system 100. Electrical power generation system 100 includes a PV array 102, an electrical storage element 104, at least one power inverter 106, a cabinet 108, and a DC link busbar 110. Electrical storage element 104, at least one power inverter 106, cabinet 108, and DC link busbar 110 are referred herein to as a power conversion system 116.

PV array 102 includes a plurality of solar cells. PV array 102 thus collects solar energy and converts the collected solar energy to electrical energy. Specifically, PV array 102 converts solar energy to direct electrical current.

In the exemplary embodiment, electrical storage element 104 includes a plurality of electrically coupled capacitors. For example, storage element 104 is a capacitor bank that includes a plurality of capacitors coupled in parallel (described below with reference to FIG. 2). Electrical storage element 104 is electrically coupled to PV array 102. Further, direct current generated by PV array 102 is supplied to electrical storage element 104 and stored as electrical energy within electrical storage element 104.

Power inverter 106 includes one or more collections of fast switching semiconductor switching elements, such as collections of SiC switching elements 112 and 114 (or "switching elements"), and converts direct current, through the switching action of switching elements 112 and 114, to alternating current. Power inverter 106 is electrically coupled to storage element 104 through DC link busbar 110. During operation, power inverter 106 generates high frequency alternating current, or noise, as a byproduct. Power inverter 106 is further coupled at one or more output terminals (not shown) to a device or system, such as a power grid, a motor or variable speed motor, and/or any other device that receives and operates on alternating electrical current.

Cabinet 108 is a protective enclosure for electrical storage element 104, power inverter 106, and DC link busbar 110. Cabinet 108 is electrically grounded and is constructed from an electrically conductive material, such as a particular metal or an alloy of several metals.

Figure 2:
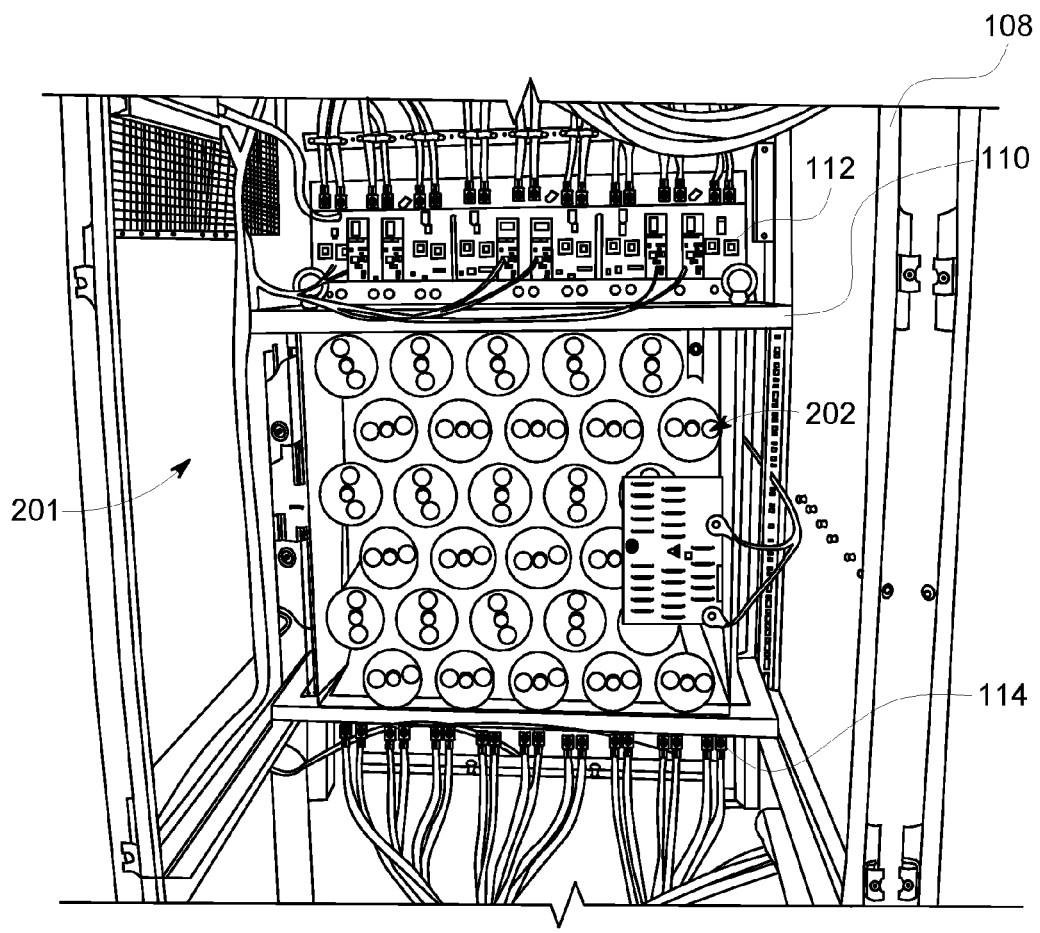
FIG. 2 is a front view of an interior of a cabinet that houses the DC link busbar shown in FIG. 1.

FIG. 2 is a front view of an interior 201 of cabinet 108. As shown and as described above, electrical storage element 104 includes a plurality of capacitors, such as capacitors 202. Although thirty capacitors 202 are shown, any suitable number of capacitors are contemplated and within the scope of this disclosure. The number of capacitors can be varied, for example, depending upon the power requirements of system 100.

Capacitors 202 are electrically coupled, through DC link busbar 110, to power inverter 106. More particularly, capacitors 202 are coupled to DC link busbar 110, and DC link busbar 110 is coupled to power inverter 106. Thus, as described in greater detail below, direct electrical current is discharged by capacitors 202 and flows through DC link busbar 110 to power inverter 106, where the direct electrical current is converted to alternating electrical current.

Figure 3:
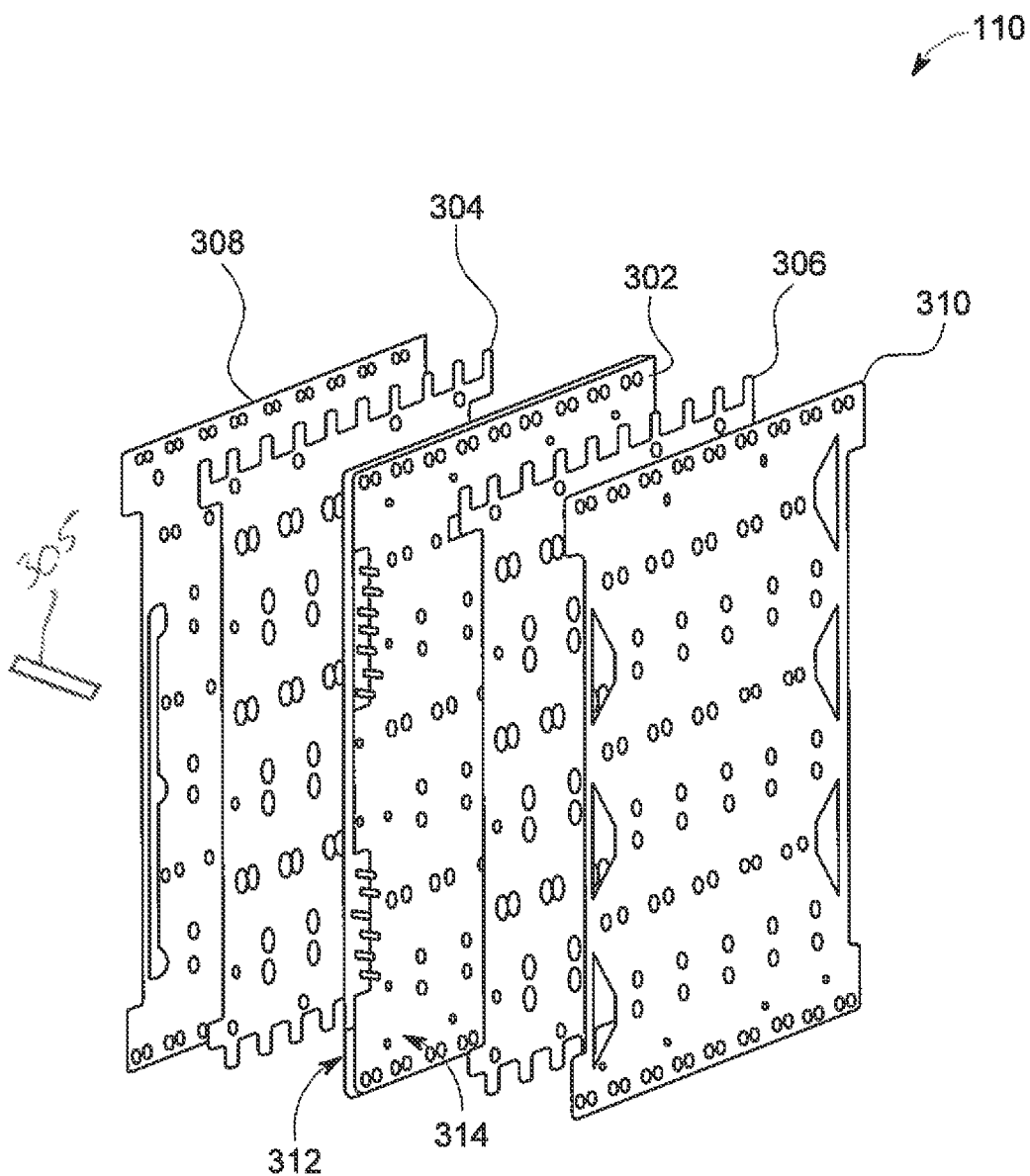
FIG. 3 is an exploded view of the DC link busbar shown in FIG. 1.

FIG. 3 is an exploded view of DC link busbar 110. In the exemplary embodiment, DC link busbar 110 includes a central planar element 302, a first conductive lamina 304, a second conductive lamina 306, a first insulative lamina 308, and a second insulative lamina 310. As described herein, first conductive lamina 304 and second conductive lamina 306 are configured to function as electromagnetic shielding and act to attenuate electromagnetic radiation generated by DC link busbar 110. Further, as described herein, first conductive lamina 304 and second conductive lamina 306 provide a path by which alternating current generated by power inverter 106 is able to return to power inverter 106. In some embodiments, DC link busbar 110 excludes first insulative lamina 308 and/or second insulative lamina 310.

Figure 4:
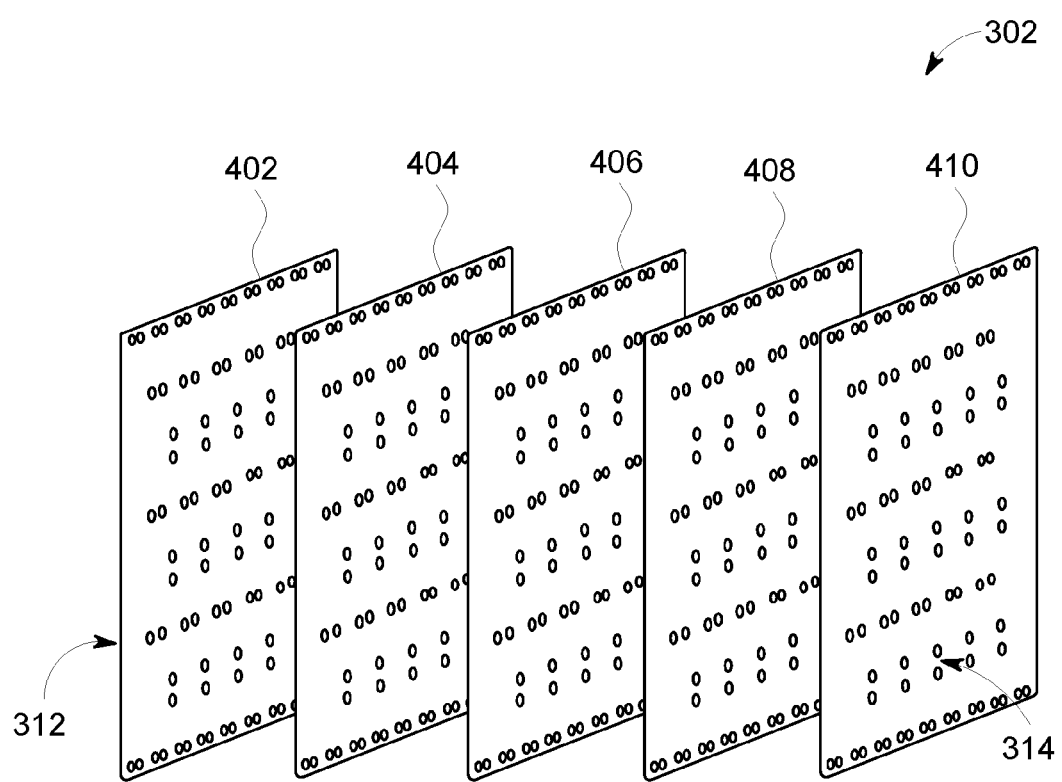
FIG. 4 is an exploded view of a central planar element of the DC link busbar shown in FIG. 1.

FIG. 4 is an exploded view of a 2-level topology central planar element 302 of DC link busbar 110. As shown, central planar element 302 includes a plurality of layers or sheets. For example, central planar element 302 includes a first insulative layer 402, a first conductive layer 404 coupled to first insulative layer 402, a second insulative layer 406 coupled to first conductive layer 404, a second conductive layer 408 coupled to second insulative layer 406, and a third insulative layer 410 coupled to second conductive layer 408. This structure represents the layout of a 2-level inverter topology, but can be expanded to any number of levels, such as, for example, any 2+n level inverter topology. In other words, any number, n, of conductive layers and any number, n, of insulation layers may be added in an alternating or interleaved arrangement (e.g., in the same order as in a2-level layout) to expand the inverter topology.

With returning reference to FIG. 3, central planar element 302 includes first surface 312 and a second surface 314. First surface 312 is axially opposed to second surface 314. Further, first surface 312 is a surface of first insulative layer 402. Similarly, second surface 314 is a surface of third insulative layer 410.

First conductive lamina 304 and second conductive lamina 306 include any suitable conductive material, such as, for example, copper material or any suitable copper alloy. First insulative lamina 308 and second insulative lamina 310 include any suitable insulative material, such as, for example, any suitable plastic material, any suitable fiberglass material, or any suitable glass epoxy material. In the exemplary embodiment, first conductive lamina 304 is electrically coupled to second conductive lamina 306, such as, for example, by one or more screws or bolts 305 that pass through each conductive lamina 304 and 306. However, any suitable electrical coupling mechanism is contemplated and within the scope of this disclosure.

Figure 5:
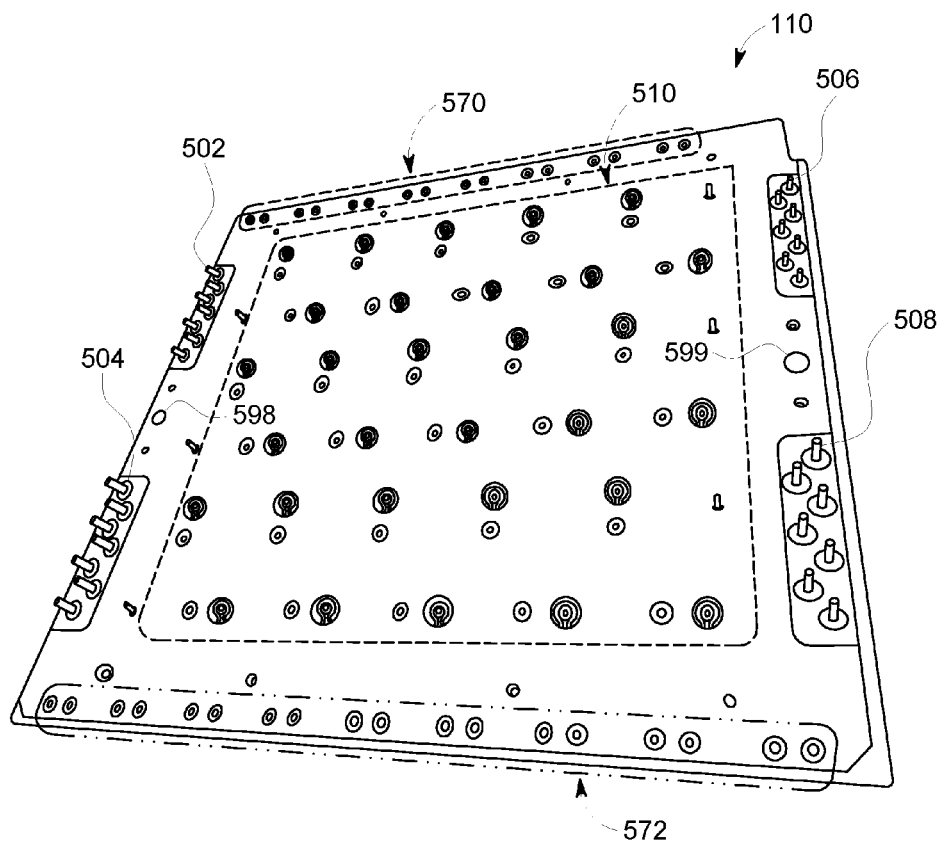
FIG. 5 is a top view of the DC link busbar shown in FIG. 1.

FIG. 5 is a top view of DC link busbar 110. In the exemplary embodiment, DC link busbar 110 includes a first positive input terminal 502, a first negative input terminal 504, a second positive input terminal 506, and a second negative input terminal 508. Positive and negative input terminals 502, 504, 506, and 508 are coupled to a power source. For example, positive and negative input terminals 502 and 504 are coupled to PV array 102. Similarly, positive and negative input terminals 506 and 508 are coupled to another power source, such as another PV array or a grid voltage. However, in some embodiments, positive and negative input terminals 506 and 508 are not used.

DC link busbar 110 further includes a plurality of positive and negative pairs of capacitor terminals, such as, for example, positive and negative pairs of capacitor terminals 510. Although thirty pairs of capacitor terminal pairs 510 are shown, any suitable number of capacitor terminal pairs are contemplated and within the scope of this disclosure. Capacitor terminal pairs 510 are further electrically coupled in parallel. In addition, capacitor terminal pairs 510 are coupled to capacitors 202.

DC link busbar 110 further includes a plurality of pairs of output terminals (or "excitation ports"), such as, for example, pairs of output terminals 570 and 572. In the exemplary embodiment, each pair of output terminals 570 and 572 includes a positive terminal and a negative terminal. In addition, although eighteen pairs of output terminals 570 and 572 are shown, any number of output terminal pairs are contemplated and within the scope of this disclosure. Further, output terminal pairs 570 and 572 are coupled to power inverter 106.

Figure 6:
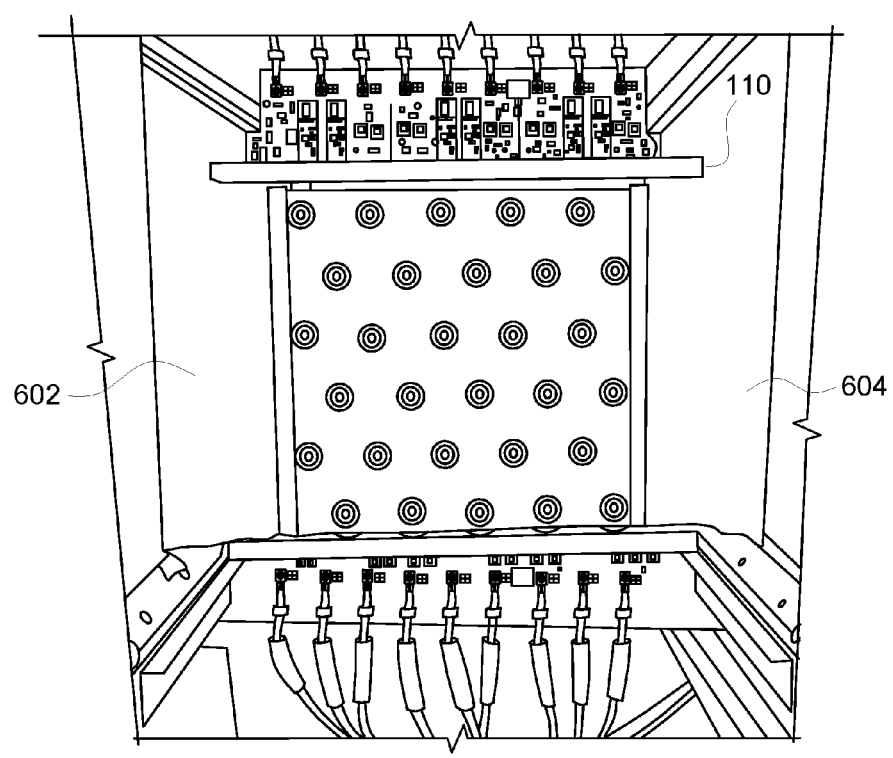
FIG. 6 is a front view of an interior of a cabinet that houses the DC link busbar of FIG. 1, in which the DC link busbar is electrically coupled to the cabinet.

FIG. 6 is a front view of interior 201 of cabinet 108, in which DC link busbar 110 is electrically coupled to cabinet 108. DC link busbar 110 includes a first contact pad 598 and a second contact pad 599. Contact pad 598 is electrically coupled to a conductive element 602, and contact pad 599 is electrically coupled to a conductive element 604. Although circular contact pads 598 and 599 are shown, any suitable contact pad shape, such as a rectangular contact pad shape that spans a length or edge of DC link busbar 110 is contemplated and within the scope of this disclosure.

As described below, conductive elements 602 and 604 are further coupled to cabinet 108 and function to conduct alternating current flowing on second conductive lamina 306 of DC link busbar 110 to ground. In some embodiments, conductive elements 602 and 604 are conductive strips or conductive fleeces. Further, in some embodiments, conductive elements 602 and 604 are woven or braided strips of conductive material. However, conductive elements 602 and 604 can include any suitable conductive material.

In operation, and with returning reference to FIG. 3, DC link busbar 110 receives direct electrical current from PV array 102. More particularly, direct electrical current flows onto DC link busbar 110 from one or more input terminals, such as one or more of input terminals 502-508. The direct electrical current is distributed by central planar element 302 to each of capacitors 202. For example, in the exemplary embodiment, direct electrical current is distributed to each of capacitors 202 by second conductive layer 408 of central planar element 302, which is electrically coupled to PV array 102 by way of input terminals 502 and 504.

Capacitors 202 are discharged through DC link busbar 110 to power inverter 106. More particularly, direct electrical current is discharged from capacitors 202 and flows through capacitor terminal pairs 510 into power inverter 106. For instance, in the exemplary embodiment, direct electrical current flows through capacitor terminal pairs 510 into first conductive layer 404 of central planar element 302 and into power inverter 106, which is electrically coupled to first conductive layer 404 of DC link busbar 110.

As described above, power inverter 106 includes switching elements 112 and 114 and converts the direct electrical current to alternating electrical current for power generation and distribution purposes. However, as a byproduct, power inverter 106 produces high frequency alternating current, or noise, which flows back onto DC link busbar 110, where it causes DC link busbar 110 to radiate in the electromagnetic frequency spectrum as an antenna element. Thus, switching elements 112 and 114 of power inverter 106 generate unwanted noise as a byproduct, which in turn, cause DC link busbar 110 to generate unwanted electromagnetic radiation.

To reduce or attenuate this effect, alternating current flowing onto DC link busbar 110 from power inverter 106 is provided a return path to inverter 106 through first conductive lamina 304 and second conductive lamina 306 of DC link busbar 110. More particularly, as described above, first conductive lamina 304 is electrically coupled to second conductive lamina 306, such as through a conductive bolt that extends between each lamina 304 and 306. Alternating current flowing through DC link busbar 110 from first conductive lamina 304 to second conductive lamina 306 is therefore able to flow along a shortened path to second conductive lamina 306 by way of the electrical connection between each lamina 304 and 306. Further, as the alternating current flows to second conductive lamina 306, the current is able to return to power inverter 106. Specifically, as described above, second conductive lamina 306 is coupled to and in electrical contact with first conductive layer 404 of central planar element 302, which is, in turn, electrically coupled to power inverter 106. Thus, alternating current flows from lamina 304 to lamina 306, from lamina 306 onto first conductive layer 404, and finally from first conductive layer 404 into power inverter 106.

In addition, alternating current flowing on DC link busbar 110 that does not return to power inverter 106 flows onto first conductive lamina 304 and/or second conductive lamina 306 of DC link busbar 110, either or both of which, as described above, are electrically grounded through one or more connections to cabinet 108. Alternating current flowing from power inverter 106 onto DC link busbar 110 therefore has two outflow paths from DC link busbar 110. The first path is through laminas 304 and 306 to power inverter 106, and the second path is through laminas 304 and 306, and through cabinet 108, to ground. Further still, electromagnetic radiation generated by DC link busbar 110 is attenuated by first conductive lamina 304 and second conductive lamina 306, which function as electrical shielding for DC link busbar 110.

Embodiments of the power conversion system, as described above, facilitate the transmission of electrical power from a power source, such as a PV array, through a shielded DC link busbar, to a power inverter. Embodiments further channel high frequency alternating current back to its source and/or shunt the high frequency alternating current, through a cabinet that houses the DC link busbar, to ground. Thus, electromagnetic radiation generated by the DC link is reduced and radiation that is generated by the DC link busbar is attenuated by conductive laminas, or shielding, included in the DC link busbar.

Exemplary technical effects of the power conversion system described herein include, for example: (a) transmitting direct current from a power source, through a shielded DC link busbar electrically grounded through a cabinet, to a power inverter; and (b) limiting or reducing electromagnetic radiation produced by the shielded DC link busbar.

Exemplary embodiments of a power conversion system and related components are described above in detail. The system is not limited to the specific embodiments described herein, but rather, components of systems and/or steps of the methods may be utilized independently and separately from other components and/or steps described herein. For example, the configuration of components described herein may also be used in combination with other processes, and is not limited to practice with the systems and related methods as described herein. Rather, the exemplary embodiment can be implemented and utilized in connection with many applications where electrical power conversion and generation are desired.

Although specific features of various embodiments of the present disclosure may be shown in some drawings and not in others, this is for convenience only. In accordance with the principles of the present disclosure, any feature of a drawing may be referenced and/or claimed in combination with any feature of any other drawing.

This written description uses examples to disclose the embodiments of the present disclosure, including the best mode, and also to enable any person skilled in the art to practice the disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A shielded direct current link ("DC link") busbar comprising:
   a central planar element comprising a first surface and a second surface, said first surface axially opposed to said second surface;
   a first conductive lamina disposed over said first surface; and
   a second conductive lamina disposed over said second surface, wherein said first conductive lamina and said second conductive lamina are electrically coupled, wherein said central planar element comprises a first insulative layer, a first conductive layer coupled to said first insulative layer, a second insulative layer coupled to said first conductive layer, a second conductive layer coupled to said second insulative layer, and a third insulative layer coupled to said second conductive layer.

2. The shielded DC link busbar of claim 1, wherein said central planar element comprises a plurality of insulative layers interleaved with a plurality of conductive layers.

3. The shielded DC link busbar of claim 1 further comprising a first insulative lamina disposed over said first conductive lamina.

4. The shielded DC link busbar of claim 1 further comprising a second insulative lamina disposed over said second conductive lamina.

5. The shielded DC link busbar of claim 1 further comprising a plurality of pairs of input and output terminals, wherein said plurality of pairs of input and output terminals are configured to electrically couple to at least one power inverter.

6. The shielded DC link busbar of claim 5, wherein said plurality of pairs of output terminals comprise a plurality of pairs of positive terminals and negeative terminals.

7. The shielded DC link busbar of claim 1 further comprising a plurality of pairs of capacitor terminals, wherein each of said plurality of pairs of capacitor terminals are configured to electrically couple to one of a plurality of capacitors.

8. The shielded DC link busbar of claim 7, wherein said plurality of pairs of capacitor terminals are electrically coupled in at least one of parallel and series.

9. The shielded DC link busbar of claim 1, wherein said first conductive lamina comprises a copper lamina.

10. The shielded DC link busbar of claim 1, wherein said second conductive lamina comprises a copper lamina.

11. The shielded DC link busbar of claim 1, wherein said first conductive lamina is in electrical contact with said first surface.

12. The shielded DC link busbar of claim 1, wherein said second conductive lamina is in electrical contact with said second surface.

13. The shielded DC link busbar of claim 1 further comprising a conductive element configured to electrically couple said DC link to ground.

14. The shielded DC link busbar of claim 13, wherein said conductive element is configured to electrically couple to a cabinet that houses said DC link.

15. A power conversion system comprising:
   a plurality of capacitors;
   at least one power inverter; and
   a shielded direct current link ("DC link") busbar according to claim 1 electrically coupled to said plurality of capacitors and said at least one power inverter.

16. The power conversion system of claim 15 further comprising a first insulative lamina disposed over said first conductive lamina.

17. The power conversion system of claim 15 further comprising a second insulative lamina disposed over said second conductive lamina.

18. A power generation system comprising:
   a power source;
   a plurality of capacitors;
   at least one power inverter; and
   a shielded direct current link ("DC link") busbar according to claim 1 electrically coupled to said power source.

* * * * *